United States Patent
Koenigsmann et al.

(10) Patent No.: US 7,081,148 B2
(45) Date of Patent: *Jul. 25, 2006

(54) TEXTURED-GRAIN-POWDER METALLURGY TANTALUM SPUTTER TARGET

(75) Inventors: Holger J. Koenigsmann, Congers, NY (US); Paul S. Gilman, Suffern, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 91 days.

This patent is subject to a terminal disclaimer.

(21) Appl. No.: 10/809,885

(22) Filed: Mar. 26, 2004

(65) Prior Publication Data

US 2004/0250924 A1    Dec. 16, 2004

Related U.S. Application Data

(63) Continuation-in-part of application No. 09/955,348, filed on Sep. 18, 2001, now Pat. No. 6,770,154.

(51) Int. Cl.
  *C22C 27/02*  (2006.01)
  *C23C 14/14*  (2006.01)
  *C23C 14/34*  (2006.01)

(52) U.S. Cl. .................... 75/245; 148/422; 204/298.13

(58) Field of Classification Search ................ 75/245; 148/422; 204/298.13
  See application file for complete search history.

(56) References Cited

U.S. PATENT DOCUMENTS

| | | | |
|---|---|---|---|
| 3,335,037 A | 8/1967 | Dunn et al. | 148/13.1 |
| 3,497,402 A | 2/1970 | Douglass et al. | 148/11.5 |
| 5,590,389 A | 12/1996 | Dunlop et al. | 419/67 |
| 5,809,393 A | 9/1998 | Dunlop et al. | 419/61 |
| 6,193,821 B1 | 2/2001 | Zhang | 148/668 |
| 6,261,337 B1 | 7/2001 | Kumar | 75/255 |
| 6,331,233 B1 | 12/2001 | Turner | 204/298.13 |
| 6,348,113 B1 | 2/2002 | Michaluk et al. | 148/668 |
| 6,770,154 B1 * | 8/2004 | Koenigsmann et al. | 148/422 |
| 6,878,250 B1 * | 4/2005 | Segal et al. | 204/298.13 |

FOREIGN PATENT DOCUMENTS

| WO | 996100 | 12/1999 |
|---|---|---|
| WO | 0031310 | 6/2000 |

OTHER PUBLICATIONS

Michaluk et al., "Tantalum 101: Economics and Technology of Ta Materials", Semiconductor International (Jul. 2000) pp. 271-278.

* cited by examiner

*Primary Examiner*—Ngoclan T. Mai
(74) *Attorney, Agent, or Firm*—Iurie A. Schwartz

(57) ABSTRACT

The sputter target includes a tantalum body having tantalum grains formed from consolidating tantalum powder and a sputter face. The sputter face has an atom transport direction for transporting tantalum atoms away from the sputter face for coating a substrate. The tantalum grains have at least a 40 percent (222) direction orientation ratio and less than a 15 percent (110) direction orientation ratio in an atom transport direction away from the sputter face for increasing sputtering uniformity, the tantalum body being free of (200)–(222) direction banding detectable by Electron Back-Scattering Diffraction and wherein the sputter target has a purity of at least 99.99 (%) percent.

14 Claims, 1 Drawing Sheet

TEXTURED-GRAIN-POWDER METALLURGY TANTALUM SPUTTER TARGET

This application is a continuation-in-part of U.S. Ser. No. 09/955,348 filed on Sep. 18, 2001 now U.S. Pat. No. 6,770,154.

FIELD OF THE INVENTION

This invention relates to the field of tantalum sputter targets. In particular, this invention relates to powder metallurgy tantalum sputter targets.

BACKGROUND OF THE INVENTION

Conventional tantalum sputter targets manufactured by casting and thermomechanical processing display alternating bands of the (200) and (222) crystallographic orientations across a sputter target's face and through the target's cross section. For example, the target's surface often exhibits alternating lighter shaded grains near the (200) orientation and darker shaded grains near the (222) orientation. Unfortunately, the (200) texture bands have a lower sputter yield than the (222) texture bands that result in substrates having tantalum sputter layers of varied thicknesses within a substrate. For example, sheet resistance uniformity of sputtered films for the 49 point test typically ranges between 2 and 3 percent 1 sigma (or one standard deviation). These non-uniform tantalum layers can cause manufacturers to increase sputtering thickness to eliminate thin regions. Furthermore, the resulting variation in tantalum thickness often precludes the use of sputtered tantalum films for demanding applications.

In the past, manufacturers have used grain growth techniques to control grain orientation. For example, Dunn et al., in U.S. Pat. No. 3,335,037, disclose a rolling/grain recrystallization method for producing tantalum foil. This method maximizes the (110) orientation to produce the tantalum foil—this product's thickness and grain orientation are each unacceptable for sputter target manufacturing.

Zhang, in U.S. Pat. No. 6,193,821, discloses a thermomechanical process for deforming a pure tantalum billet into a sputter target. This process first relies upon side-forging or side-rolling and then upon upset forging or upset rolling. The process produces sputter targets having a predominantly (222) texture and a grain size of less than 25 μm. This process does not appear to eliminate all banding effects associated with targets formed from cast tantalum targets or align the (222) texture in a direction normal to the sputter target's face.

In another thermomechanical process, Michaluk et al., in Pat. Pub. No. WO 00/31310 disclose a process for casting and processing tantalum sputter targets. This process appears to produce tantalum blanks having a primary (222) texture in a direction normal to the sputter target's face with minimal (200)–(222) texture banding throughout the thickness of the blanks. (This specification refers to directions with the convention that for a body-centered cubic (bcc) lattice, h+k+l must equal an even number for the reflection to have a non-zero intensity, the bcc lattice gives rise to a systematic absence when h+k+l is odd. For example, this specification refers to (222) and (200) directions rather than the (111) and (100) directions referenced by other conventions.) Unfortunately, controlling the (222) and (200) directions alone does not provide the necessary grain orientation or control required for the most stringent sputtering applications.

SUMMARY OF THE INVENTION

The sputter target includes a tantalum body having tantalum grains formed from consolidating tantalum powder and a sputter face. The sputter face has an atom transport direction for transporting tantalum atoms away from the sputter face for coating a substrate. The tantalum grains have at least a 40 percent (222) direction orientation ratio and less than a 15 percent (110) direction orientation ratio in an atom transport direction away from the sputter face for increasing sputtering uniformity, the tantalum body being free of (200)–(222) direction banding detectable by Electron Back-Scattering Diffraction and wherein said sputter target has a purity of at least 4N (i.e., 99.99 (%) percent) and preferably at least 4N5 (i.e., 99.995 (%) percent).

DESCRIPTION OF PREFERRED EMBODIMENT

Textured-grain-powder metallurgy tantalum targets fabricated to maximize the (222) direction orientation ratio and minimize the (110) direction orientation ratio provide a significant improvement in sheet resistance uniformity in comparison to conventional wrought tantalum targets. For purposes of this specification, orientation ratio is defined as the relative proportion of a particular grain orientation in relation to total grains, expressed in percent. For example, grain orientation may be calculated measuring the intensity of an x-ray peak and dividing it by the relative intensity of that peak listed in the Joint Committee on Powder Diffraction Standards (JCPDS) card. This ratio is then multiplied by 100 percent and normalized, i.e. divided by the sum of all grain orientation ratios between the intensities and their corresponding relative intensities.

Figure 1:
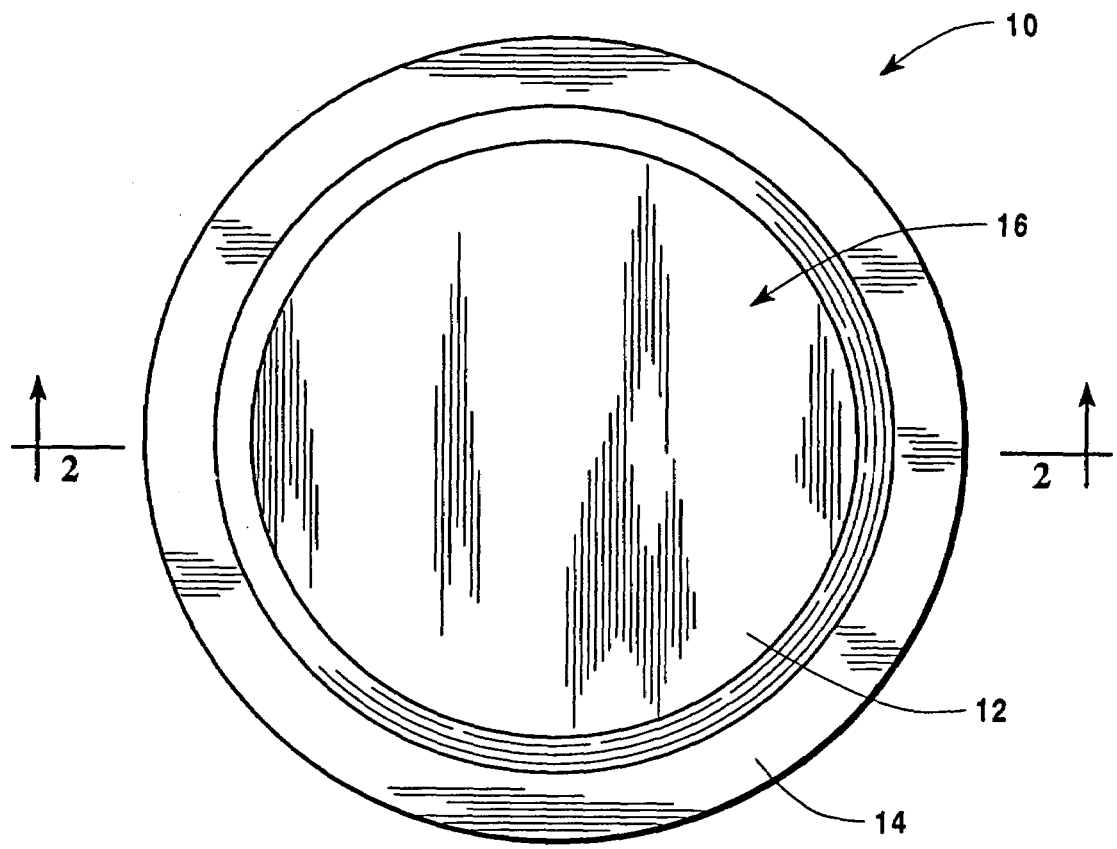
FIG. 1 is a schematic top view of a textured-grain-powder metallurgy tantalum sputter target.
Figure 2:
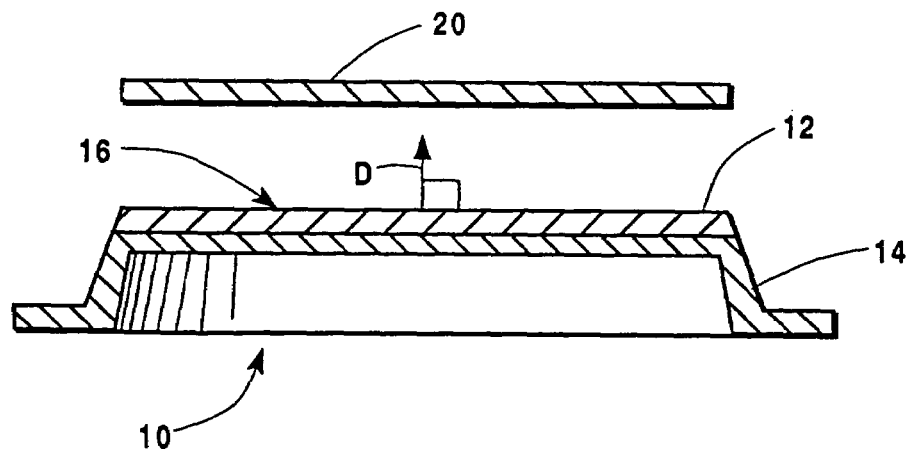
FIG. 2 is a schematic cross section of the sputter target of FIG. 1 taken along plane 2—2.

Referring to FIGS. 1 and 2, a typical target 10 contains a tantalum body 12 and a backing plate 14. Advantageously, backing plate 14 has a copper, copper alloy or aluminum alloy construction to lower fabrication costs and improve the mechanical integrity of the target. The tantalum body 12 has a purity of at least 99.99 (%) percent and includes a sputter face 16. Preferably, the purity of the tantalum body is at least 99.995 (%) percent. The sputter face has an atom transport direction D for transporting tantalum atoms away from the sputter face 16 for coating a substrate 20. The target uses the atom transport direction as a reference direction for the textured grains. Most advantageously, the atom transport direction D is orthogonal to the sputter face 16.

The textured-grain-powder metallurgy tantalum target preferentially aligns the grains in the (222) direction with the atom transport direction. The (222) direction is the close-packed direction for bcc crystal structures. The target contains at least about 40 percent (222) direction orientation ratio to improve sputtering uniformity and has a purity of 99.995 (%) percent. Advantageously, the target contains at least about 45 percent (222) direction orientation ratio to further improve sputtering performance. The target most advantageously contains at least about 50 percent (222) direction orientation ratio to facilitate effective sputtering. Experimental tantalum sputtering has shown that sputtering performance increases with greater (222) direction grain alignment in the atom transport direction. However, maximizing the (222) direction alone is insufficient to produce sputter targets with exceptional sputtering uniformity.

In addition to maximizing the grains having the (222) direction, the sputter target must also minimize the grains having the (110) direction as aligned with the atom transport direction. For example, powder metallurgy targets having a relatively high orientation ratio of (222) direction grains and about 25 percent (110) direction orientation ratio have a sputtering performance equal to traditional wrought sputter targets. Maintaining the orientation ratio of the (110) direction below about 15 percent in the atom transport direction is critical to achieving excellent sputtering results. Advantageously, the sputter target contains an orientation ratio in the (110) direction of less than about 10 percent in the atom transport direction to further maximize sputtering uniformity. Most advantageously, the sputter target contains an orientation ratio in the (110) direction of less than about 5 percent in the atom transport direction to further maximize sputtering uniformity. Furthermore, careful control of tantalum powder's consolidation and subsequent processing can maintain orientation in the (110) direction to less than about 3 percent in the atom transport direction.

Unlike the (222) and (110) directions, the (200), (211) and (310) directions have minimal impact upon sputtering performance. Advantageously, the target maintains each of the orientation ratios of the (200), (211) and (310) directions aligned with the atom transport direction to less than about 30 percent to maintain sputtering uniformity. Most advantageously, the target maintains each of the orientation ratios of the (200), (211) and (310) directions aligned with the atom transport direction to less than about 25 percent to maintain sputtering uniformity.

Forming the tantalum body from consolidating powder eliminates the visible (200)–(222) banding often associated with wrought sputter targets. Eliminating the banding provides a further increase in sputter film uniformity. In addition, the sputter targets optionally have a grain aspect ratio of less than about 1.5. For purposes of this specification, aspect ratio is grain length measured in the thickness direction divided by the grain length measured in a direction parallel with the plane of the sputter face. Most advantageously, the aspect ratio is less than about 1.3.

EXAMPLE 1

The following table summarizes preliminary experiments conducted in a 603 batch sputter system manufactured by MRC with 4" (10 cm) diameter targets. Sputter testing in this system was conducted at a power of 640 W for up to 15 kWh, a wafer scan speed of 16 cm/min corresponding to a film thickness of 1000 Å, a chamber pressure of 10 mTorr, and a target-to-wafer spacing of 2.0 inches (5.1 cm). The sheet resistance was measured at 9 points on silicon oxide wafers having a diameter of 75 mm with a 6 mm edge exclusion.

For purposes of this specification lettered targets represent comparative examples and numbered targets represent examples of the invention. Although the sputter conditions were not optimized, all experiments were conducted under identical conditions and therefore allowed a comparison between a cast and thermomechanically processed reference target (Target A) and various powder metallurgy targets (Targets B to G and 1). Orientation ratios contained in the Examples were calculated from x-ray peak intensities as described above.

TABLE 1

4" (10 cm) Sputter Targets

| Property | | A | B | C | D | E | F | 1 |
|---|---|---|---|---|---|---|---|---|
| Rs | 2 kWh | 4.8 | 8.3 | 4.6 | 4.9 | 7.7 | 4.4 | 4.3 |
| Uni- | 5 kWh | 5.1 | 2.2 | 4.8 | 4.7 | 7.2 | 4.9 | 4.5 |
| formity | 10 kWh | 6.2 | N/A | 4.4 | 5.2 | 7.2 | 5.2 | 4.5 |
| (%) | 15 kWh | 6.4 | 2.0 | 6.5 | 5.2 | 7.2 | 5.3 | 4.1 |
| Grain Size (microns) | | 50–100 | 38 | 26 | N/A | 111 | 32 | 34 |
| Aspect Ratio | | 1.0–1.5 | 1.3 | 1.4 | N/A | 1.1 | 1.4 | 1.1 |
| Orien- | (110) | 30 | 30 | 33 | 34 | 29 | 32 | 1 |
| tation | (200) | 19 | 19 | 17 | 17 | 19 | 18 | 20 |
| Ratios | (211) | 15 | 15 | 16 | 15 | 16 | 15 | 10 |
| (%) | (310) | 16 | 17 | 17 | 15 | 17 | 17 | 9 |
| | (222) | 20 | 19 | 17 | 19 | 19 | 18 | 60 |

Target 1, having a high orientation ratio of the (222) direction and a low orientation ratio of the (110) direction displayed optimum sputter and microstructural properties. The manufacturing parameters of this target were then selected for full-scale testing with 12" (30 cm) RMX-12 targets in an Eclipse sputter system.

EXAMPLE 2

The powder metallurgy RMX-12 sputter targets exhibited an average grain size of 40 to 50 microns and a high (222) crystallographic orientation ratio.

Sputter testing in the Eclipse system was conducted at a power of 10 kW for up to 50 kWh, a deposition time of 60 seconds, an argon flow rate of 100 sccm, a chamber pressure of 15 mTorr, a wafer temperature of 150° C., and a target-to-wafer spacing of 2.5 inches (6.4 cm). The sheet resistance was measured at 49 points on silicon oxide wafers having a diameter of 150 mm with a 6 mm edge exclusion.

Table 2 summarizes grain orientation data of a conventional target manufactured by casting and thermomechanical processing (Target G) and two powder metallurgy targets with forging (Target 2) and without forging (Target 3).

TABLE 2

| | Grain Orientation Ratio (Percent) | | |
|---|---|---|---|
| Grain Orientation | Cast/Pressed Target G | P/M Target (Forged) 2 | P/M Target (Not Forged) 3 |
| (110) | 30 | 1 | 1 |
| (200) | 19 | 20 | 20 |
| (211) | 15 | 10 | 10 |
| (310) | 16 | 9 | 9 |
| (222) | 20 | 60 | 60 |
| (200)–(222) Banding | Yes | No | No |

Table 2 illustrates the dramatic difference in (110) direction orientation ratio and (222) direction orientation ratio achieved with the textured-grain-powder metallurgy targets. Furthermore, the textured-grain-powder metallurgy targets were free of the deleterious (200)–(222) banding often associated with cast and worked products—these targets did not contain any (200)–(222) banding visible without magnification after macro-etching in a solution of 50 volume percent hydrofluoric acid and 50 volume percent hydrogen peroxide. Furthermore, the macro-etched targets did not contain any (200)–(222) banding detectable by Electron Back-Scattering Diffraction (EBSD)—EBSD determines a target's grain orientations throughout its entire thickness.

Table 3 summarizes 1 sigma sheet resistance uniformity data for the Targets of Table 2.

TABLE 3

| Target Life (kWh) | 1 Sigma Sheet Resistance Uniformity (%) | | | | | |
|---|---|---|---|---|---|---|
| | Cast/Pressed Target G | | P/M Target (Forged) 2 | | P/M Target (Not Forged) 3 | |
| | Wafer 1 | Wafer 2 | Wafer 1 | Wafer 2 | Wafer 1 | Wafer 2 |
| 12 | 2.76 | 2.78 | 1.32 | 1.47 | 1.15 | 1.07 |
| 20 | 2.81 | 2.86 | 1.15 | 1.21 | 1.40 | 1.10 |
| 50 | 2.97 | 2.91 | 1.33 | 1.16 | 1.10 | 1.14 |

The powder metallurgy sputter target 2 was manufactured by consolidating powder to a density close to the theoretical density, rolling, annealing, solder bonding to backing plates, and machining. Adding an optional forging step before target 2's rolling step for target 3 showed no significant effect on the sheet resistance uniformity of the sputtered films or the appearance of the sputtered target surface. The textured sputter targets 2 and 3 each coated the substrate with a maximum of less than about 1.5 percent 1 sigma sheet resistance uniformity in the rotating magnetron sputtering chamber using the RMX type magnet.

Tantalum sputter targets manufactured by consolidating powder to a density close to the theoretical density, followed by rolling and annealing, did not display alternating texture bands and exhibited a significantly improved sheet resistance uniformity. While examples for fabricating target blanks are given, it is noteworthy that this invention can be used with similar effectiveness if the target blanks are fabricated using different methods. Blank fabrication methods may include but are not limited to rolling, forging, pressing, and combinations thereof.

As illustrated in Tables 2 and 3, carefully controlling the (110) and (222) crystallographic orientations improves sputtering results. In particular, textured-grain-powder metallurgy sputtering targets having low (110) crystallographic orientation combined with high (222) orientation and the absence of alternating (222) and (200) texture bands have improved sputter performance in comparison to conventional wrought targets. For example, these targets have lowered sheet resistance uniformity of sputtered films from above 2.7 percent to between 1.1 and 1.5 percent (1 sigma).

Many possible embodiments may be made of this invention without departing from the scope thereof, it is understood therefore that all matter set forth herein is to be interpreted as illustrative and not in a limiting sense.

We claim:

1. A tantalum sputter target, the sputter target comprising: a tantalum body having tantalum grains formed from consolidating tantalum powder, the tantalum body having a sputter face, the sputter face having an atom transport direction for transporting tantalum atoms away from the sputter face for coating a substrate, the tantalum grains having at least about a 40 percent (222) direction orientation ratio and less than about a 15 percent (110) direction orientation ratio in an atom transport direction away from the sputter face for increasing sputtering uniformity, the tantalum body being free of (200)–(222) direction banding detectable by Electron Back-Scattering Diffraction and wherein said sputter target has a purity of at least 99.99 (%) percent.

2. The sputter target of claim 1 wherein the atom transport direction is orthogonal to the sputter face.

3. The sputter target of claim 1 wherein the grains have at least about a 45 percent (222) direction orientation ratio and less than about a 10 percent (110) direction orientation ratio in the atom transport direction.

4. The sputter target of claim 1 wherein the grains have less than about a 30 percent (200) direction orientation ratio, less than about a 30 percent (211) direction orientation ratio and less than about a 30 percent (310) direction orientation ratio.

5. The sputter target of claim 1 wherein said sputter target has a purity of at least 99.995 (%) percent.

6. A tantalum sputter target, the sputter target comprising: a tantalum body having tantalum grains formed from consolidating tantalum powder, the tantalum body having a sputter face, the sputter face having an atom transport direction for transporting tantalum atoms away from the sputter face for coating a substrate, the tantalum grains having at least about a 45 percent (222) direction orientation ratio, less than about a 30 percent (200) direction orientation ratio, less than about a 30 percent (211) direction orientation ratio, less than about a 30 percent (310) direction orientation ratio and less than about a 10 percent (110) direction orientation ratio in the atom transport direction away from the sputter face for increasing sputtering uniformity, the tantalum body being free of (200)–(222) direction banding detectable by Electron Back-Scattering Diffraction and wherein said sputter target has a purity of at least 99.99 (%) percent.

7. The sputter target of claim 6 wherein the atom transport direction is orthogonal to the sputter face.

8. The sputter target of claim 6 wherein the grains have at least about a 50 percent (222) direction orientation ratio and less than about a 5 percent (110) direction orientation ratio in the atom transport direction.

9. The sputter target of claim 6 wherein the grains have less than about a 25 percent (200) direction orientation ratio, less than about a 25 percent (211) direction orientation ratio and less than about a 25 percent (310) direction orientation ratio.

10. A tantalum sputter target, the sputter target comprising: a tantalum body having tantalum grains formed from consolidating tantalum powder, the tantalum body having a sputter face, the sputter face having an atom transport direction for transporting tantalum atoms away from the sputter face for coating a substrate, the tantalum grains having at least about a 50 percent (222) direction orientation ratio, less than about a 25 percent (200) direction orientation ratio, less than about a 25 percent (211) direction orientation ratio, less than about a 25 percent (310) direction orientation ratio and less than about a 5 percent (110) direction orientation ratio in the atom transport direction from the sputter face for increasing sputtering uniformity, the tantalum body being free of (200)–(222) direction banding detectable by Electron Back-Scattering Diffraction and wherein said sputter target has a purity of at least 99.99 (%) percent.

11. The sputter target of claim 10 wherein the atom transport direction is orthogonal to the sputter face.

12. The sputter target of claim 10 wherein the target coats the substrate with a maximum of about 1.5 percent 1 sigma sheet resistance uniformity in a rotating magnetron sputtering chamber using an RMX type magnet.

13. The sputter target of claim 6 wherein said sputter target has a purity of at least 99.995 (%) percent.

14. The sputter target of claim 10 wherein said sputter target has a purity of at least 99.995 (%) percent.

* * * * *